United States Patent
Bhargava et al.

(10) Patent No.: US 11,650,233 B2
(45) Date of Patent: May 16, 2023

(54) FAST RESPONSE LOAD CURRENT SENSING APPARATUS AND METHOD

(71) Applicant: Intel Corporation, Santa Clara, CA (US)

(72) Inventors: Neha Bhargava, Bangalore (IN); Arvindh Rajasekaran, Bangalore (IN); Anup Deka, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 154 days.

(21) Appl. No.: 17/124,358

(22) Filed: Dec. 16, 2020

(65) Prior Publication Data
US 2021/0389353 A1   Dec. 16, 2021

(30) Foreign Application Priority Data

Jun. 11, 2020   (IN) .............................. 202041024526

(51) Int. Cl.
| | |
|---|---|
| *G01R 19/25* | (2006.01) |
| *H03K 5/24* | (2006.01) |
| *G01R 31/40* | (2020.01) |
| *H03K 21/08* | (2006.01) |
| *H03M 1/66* | (2006.01) |

(52) U.S. Cl.
CPC ............ *G01R 19/25* (2013.01); *G01R 31/40* (2013.01); *H03K 5/24* (2013.01); *H03K 21/08* (2013.01); *H03M 1/66* (2013.01)

(58) Field of Classification Search
CPC .......... G01R 19/25; G01R 31/40; H03K 5/24; H03K 21/08; H03M 1/66
USPC .................................................. 324/20, 76.11
See application file for complete search history.

(56) References Cited

U.S. PATENT DOCUMENTS

| | | | |
|---|---|---|---|
| 11,368,112 B2* | 6/2022 | Krishnamurthy | ......... H02P 8/22 |
| 2008/0111521 A1 | 5/2008 | So et al. | |
| 2013/0265060 A1 | 10/2013 | Orendi et al. | |
| 2015/0084605 A1* | 3/2015 | Ho | ........ G01R 19/175 323/235 |
| 2017/0047840 A1* | 2/2017 | Campos | ................ G01R 19/00 |
| 2021/0367505 A1* | 11/2021 | Chen | ................... H02M 3/1582 |
| 2022/0149737 A1* | 5/2022 | Yang | ................... H02M 3/1582 |
| 2022/0271666 A1* | 8/2022 | Hsu | ..................... H02M 3/1582 |

OTHER PUBLICATIONS

Office Action dated Apr. 4, 2022 for IN Application No. 202041024526, 5 pages.

* cited by examiner

*Primary Examiner* — Giovanni Astacio-Oquendo
(74) *Attorney, Agent, or Firm* — Schwabe, Williamson & Wyatt, P.C.

(57) ABSTRACT

A fast load current sensing apparatus and scheme provides instantaneous detection of peak current excursions using low silicon area and power efficient techniques. The response time for detecting signal excursions and measuring a signal (e.g., load current) is independent of resolution or precision and can be applied to high resolution telemetry. The apparatus sends out maximum current limit (FHC_limit) code at any instant the load current is detected to be more than a digital-to-analog converter (DAC) code. If the load current is less than the FHC_limit the scheme restores to a next DAC code as per a counter's next value. In case load current is more than FHC_limit, the scheme updates the DAC code to FHC_limit code and starts the counter from the FHC_limit.

23 Claims, 11 Drawing Sheets

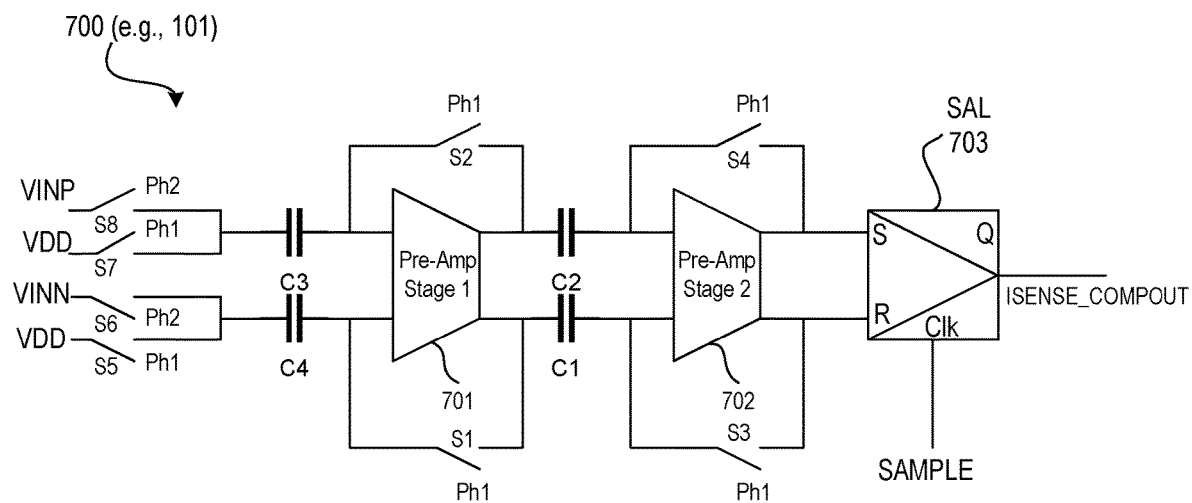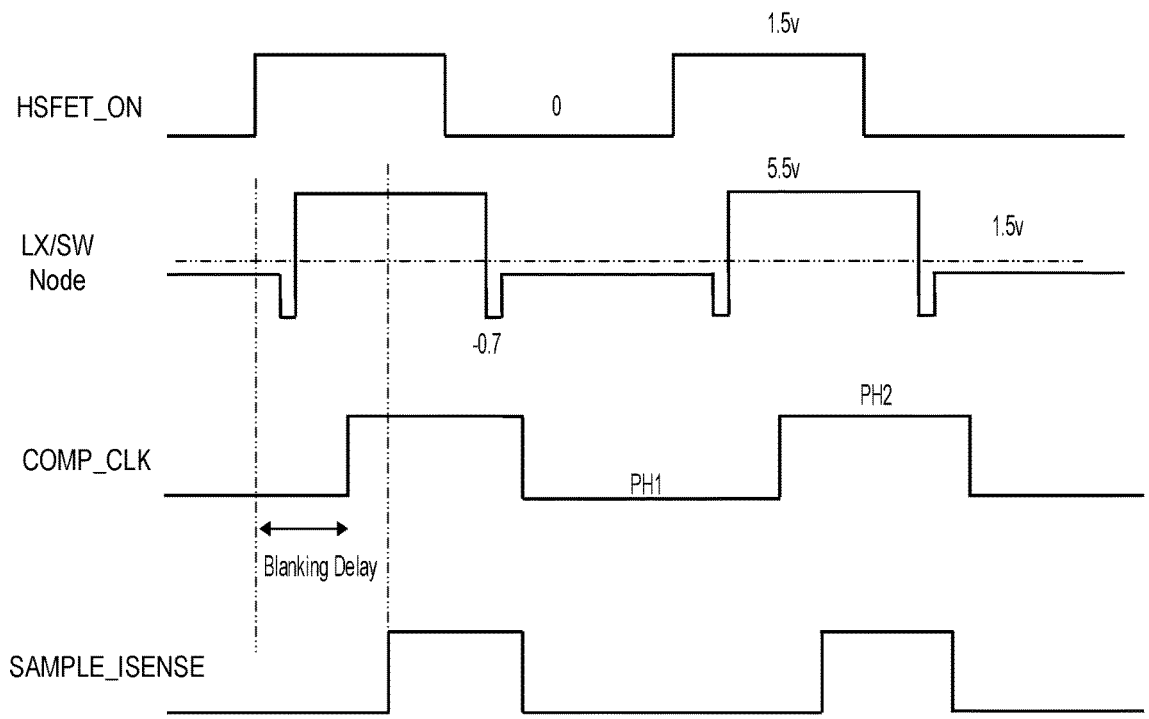
Fig. 7

FAST RESPONSE LOAD CURRENT SENSING APPARATUS AND METHOD

CLAIM FOR PRIORITY

This application claims the benefit of priority to Indian Patent Application No. 202041024526, filed on Jun. 11, 2020, titled "FAST RESPONSE LOAD CURRENT SENSING APPARATUS AND METHOD" and which is incorporated by reference in entirety.

BACKGROUND

Load current sensing provides a customer real-time information about current consumed by different power supply rails in a system-on-chip (SoC). This information is useful for debug and testing to determine whether a software application is consuming higher current than anticipated. Further, an operating system and/or a SoC can use this information in conjunction with temperature data for thermal throttling and fan speed control. Low latency current reporting can be used to detect a Power Virus condition in SoC upon which the SoC can allow exceeding maximum current and/or maximum power (Iccmax/Pmax) for a small duration (e.g., approximately 1 μs) and reduce guard band in normal operation. Accurate and fast current sensing is therefore desired.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 7 illustrates current comparator circuit and associated timing diagram, in accordance with some embodiments.

DETAILED DESCRIPTION

Figure 1:
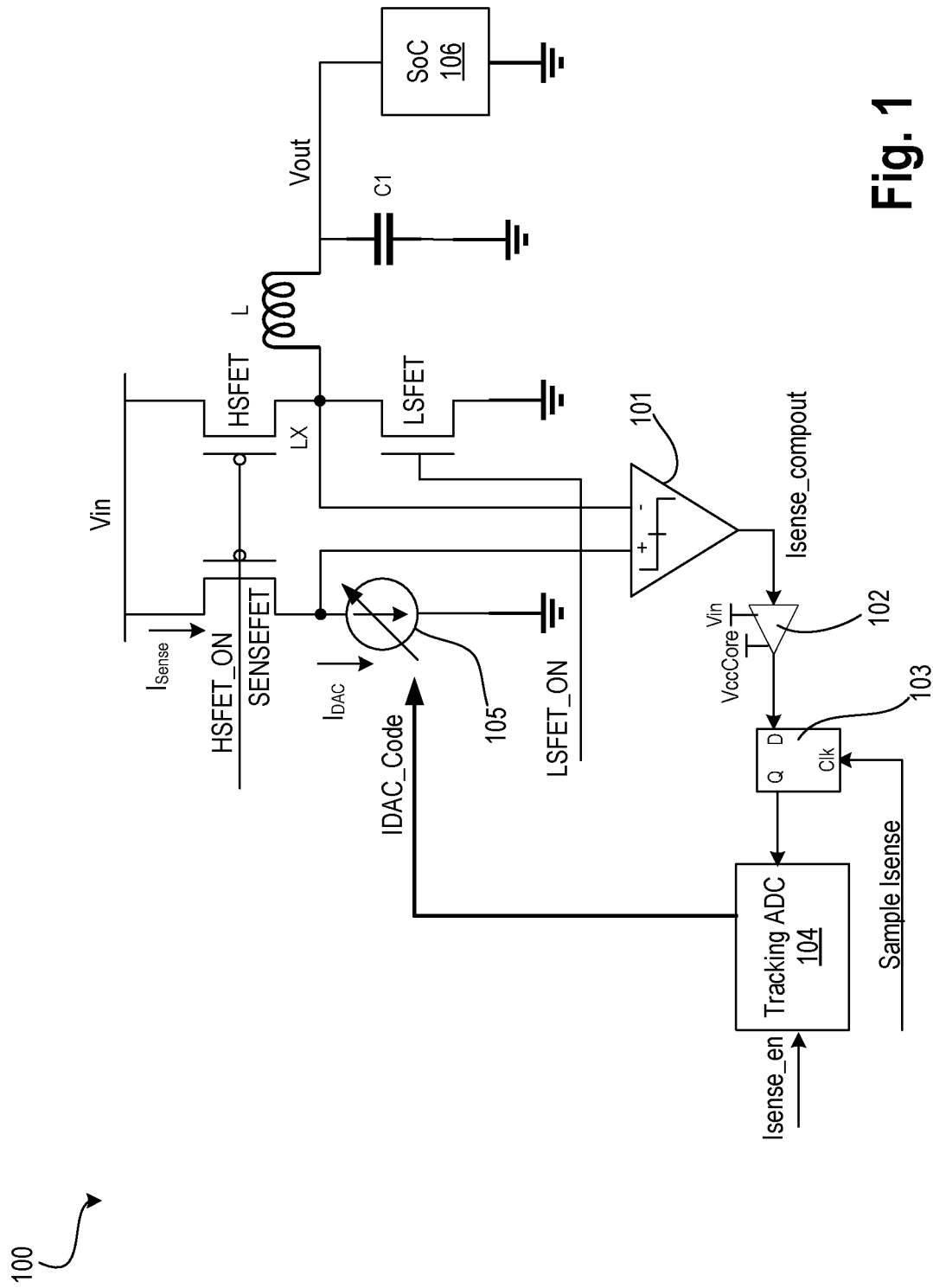
FIG. 1 illustrates a fast load current tracking apparatus, in accordance with some embodiments.

Existing schemes for sensing load current include analog schemes which rely on averaging inductor current to obtain the load current. For example, a sense resistor is placed in series with the inductor to sense voltage across it, which is used to measure the inductor and load current. In another example, a low pass filter can be used to filter the voltage across the inductor and sense the current through a DC resistance of the inductor. In another example, a current sensing transistor is coupled in parallel with the power transistor (e.g., high-side switch of a regulator) with an amplifier to eliminate the drain-to-source voltage (Vds) mismatch to mirror the power transistor current into a resistor followed by low pass filtering.

For analog schemes that rely on averaging the inductor current, the low pass filter bandwidth (BW) is determined by the minimum Discontinuous Conduction Mode (DCM) current that needs to be sensed as the filter BW is usually about 5 times lower than the minimum DCM frequency. Because of the low bandwidth, the current sensing circuit cannot track the load current fast enough during a load transient. For example, a Constant On Time (CoT) buck converter designed for 2.5 MHz typical switching frequency will have a DCM frequency of 400 kHz when used at an input voltage Vin of 3.3V, an output voltage Vout of 1.2 with 220 nH inductor, and a 47 μF output capacitor. This means that during load transients, the current sensing circuitry will take about 4τ or 10 us to track the load current.

Existing schemes for sensing load current also include digital schemes. In one such scheme, instead of averaging, the current through a sensing transistor can be sampled at the midpoint of the inductor current ramp to figure out the load current. Digital pulse width modulator (PWM) controllers where the high pulse width is indicated by a digital code (e.g., a multi-bit code) and generated using a PWM modulator (a series of delay lines or frequency counter running at a clock frequency higher than switching frequency) can generate a second signal indicating the midpoint of a High-Side FET (HSFET) on pulse for current sampling.

In another example, a digital current tracking algorithm can compare the current through the sensing transistor against a current through a current digital-to-analog converter (IDAC) and increment/decrement the IDAC code in a switching cycle (e.g., every cycle or every other cycle) based on the comparison. The tracking algorithm can have options to take higher jumps in the IDAC code for faster conversion during a load transient. For example, the step size for the IDAC code can be adaptive. However, known tracking algorithms may not timely identify current excursions above a threshold, and in some cases may not identify any current excursions leading to incorrect telemetry, and subsequent logic operations (e.g., interrupts, throttling, etc.). One way to improve the speed and accuracy of a tracking algorithms is to use flash analog-to-digital converters (ADCs). However, flash ADCs are costly in terms of area and power.

Some embodiments use fast load current sensing apparatus in switching converters. The sensing scheme and apparatus provides instantaneous detection of peak current excursions using low silicon area and power efficient techniques. While the embodiments are explained with reference to detecting rapid excursions in load current, the embodiments can be expanded to monitor any slow or fast changing signals in any application. The apparatus sends out maximum current limit (FHC_limit) code at any instant the load current is detected to be more than a digital-to-analog converter (DAC) code. Here, the DAC code is the normal code generated by an up/down counter, and has uniform step size. If the load current is less than the FHC_limit (e.g., a current threshold limit) the scheme restores to a next DAC code as per the up/down counter's next value. In case the load current is more than the FHC_limit, the scheme updates the DAC code to the FHC_limit code and starts the counter from the FHC_limit code.

There are many technical effects of various embodiments. For example, accurate load current sensing for different power rails allow for debugging and/or measuring power consumption of a processor in idle and/or active operating modes. The apparatus of various embodiments allows for low latency current reporting to detect virus condition and to allow for higher maximum current (Iccmax) for short durations. As such, guard banding can be reduced in normal operations. As load currents occur in bursts in a modern processor, a low latency current sensing helps a buck converter to enter and/or exit low power mode, process throttling, and/or for quick phase addition and/or shedding for better average efficiency. The response time for detecting signal excursions and measuring a signal (e.g., load current) is independent of resolution or precision and can be applied to high resolution telemetry. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" here generally refers to any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates current tracking apparatus 100 and associated timing diagram, in accordance with some embodiments. Apparatus 100 comprises a regulator including p-type high-side switch HSFET (high-side field effect transistor), n-type low-side switch LSFET, p-type sense transistor SENSEFET, sampling comparator 101, level-shifter 102, sampling sequential circuit 103, finite state machine (FSM) or tracking ADC 104, and adjustable current digital-to-analog converter ($I_{DAC}$) 105 coupled as shown.

HSFET and LSFET of the regulator are coupled to a first terminal inductor L via node LX. A second terminal of inductor L is coupled load capacitor C1 and load (e.g., system-on-chip (SoC) 106, or any suitable load). The input supply to the regulator is Vin while the output supply Vout is the regulated supply. Signal HSFET_ON controls HSFET and SENSEFET while signal LSFET_ON controls the LSFET. Tracking ADC 104 generates an adjustable code IDAC_Code (e.g., a multi-bit code) when Isense_en is asserted. The multi-bit code is used to adjust a current strength through IDAC 105. When Isense_en is de-asserted, tracking ADC 104 is disabled and the current sensing circuitry is thus disabled.

In some embodiments, SENSEFET is used to mirror the HSFET current. As such, SENSFET and HSFET are controlled by a same signal, HSFET_ON. In some embodiments, SENSEFET is the same size as HSFET. In some embodiments, SENSEFET has a lower ratio than HSFET (e.g., the ratio of the size is lower). In some embodiments, the SENSEFET current ($I_{Sense}$) is sampled at the midpoint of the inductor current ramp in Continuous Conduction Mode (CCM), to correspond to the load current. Here, load current is indicated by the N-bit code, IDAC_Code. In some embodiments, the SENSEFET current $I_{Sense}$ is compared against $I_{DAC}$ current at a sampling point. Here, $I_{DAC}$ current is the current through the current DAC 105.

DAC 105 is an apparatus that converts digital data (e.g., binary or thermometer coded IDAC_Code[N:0]) into current analog signal. In some embodiments, DAC 105 is a switched binary weighted current source. In other embodiments, other type of DACs such as thermometer coded switched current sources DAC, segmented current sources DAC, etc. may be used for implementing DAC 105. Any suitable current DAC may be used for implementing DAC 105. Any suitable DAC may be used for implementing DAC 105.

Based on $I_{DAC}$ current being higher or lower than SENSEFET current $I_{Sense}$, as indicated by the comparator output Isense_compout being '1' or '0', tracking ADC 104 increments or decrements the $I_{DAC}$ current in every switching cycle such that it tracks the load current. The switching cycle is based on a clock which generates the HSFET_ON and LSFET_ON signals. In some embodiments, tracking ADC 104 uses an up/down counter with adaptive count step size to drive DAC 105 continuously and compare the DAC output with the analog signal to be sensed. The up/down control of tracking ADC 104 is controlled by the output of comparator 101. If the analog signal to be sensed is more than the DAC output, the counter of tracking ADC 104 counts up. If the analog signal is less than the DAC output the counter starts counting down. In this way the output of the DAC tracks the analog signal. Here, tracking ADC 104 digitizes load current in a buck converter. However, the embodiments can be used to track any analog signal.

At steady state load, when tracking ADC 104 converges, the $I_{DAC}$ code dithers between two codes. These two codes may be separated by one or two least significant bits (LSBs). For example, the two codes are two neighboring codes. $I_{DAC}$ code can be a binary code, thermometer code, or any other suitable code. In some embodiments, to track load current (e.g., current through inductor L), the sampling point for comparator 101 coincides with the exact midpoint of inductor ramp or the HSFET On Phase. In some embodiments, comparator 101 comprises a single-stage amplifier. In some embodiments, comparator 101 comprises a multi-stage amplifier.

IDAC 105 and selected replica from SENSFET set the reference voltage for comparator 101. Here, transistor SENSEFET and IDAC 105 form a replica branch that replicates a branch comprising HSFET and LSFET. Comparator 101 triggers when the voltage across the power device HSFET exceeds the reference voltage. A slight variation of the tracking algorithm in tracking ADC 104 varies the step size of the counter adaptively. In some embodiments, if the current is continuously more than the reference for a couple of switching cycles, for example, the step size is increased by a larger step than before but, if current is settling, the step size is decreased steadily.

Some applications might need an immediate indication that current excursion is above a maximum current limit e.g., fast high current interrupt (FHC_INT) threshold. Crossing the FHC_INT threshold results in the processor (or any suitable logic of the processor or system-on-chip (SoC)) issuing a FHC_INT, an interrupt. This interrupt is helpful in case the current drawn from a SoC rail peaks but on knowing this condition SoC can start throttling. Here, throttling generally refers to lowering one or more performance parameters of a processor. The performance parameters include operating frequency, voltage, dynamic capacitance, etc. The convergence time of the tracking scheme depends on the ramp rate of current and step size of the up/down counter that generates a code to control IDAC 105. In case of a fast current excursion, even with adaptive step size tracking scheme, it is possible that by the time the tracking scheme is able to send out the DAC codes near the high current limit, the current excursion disappears.

The tracking ADC 104 of various embodiments mitigates these cases by sending out a maximum current limit (FHC_limit) code at any instant the load current is detected to be more than the DAC code. Here, the DAC code is the normal code generated by the up/down counter of ADC 104, and has uniform step size. If the load current is less than the FHC_limit (e.g., a current threshold limit) the scheme restores to a next DAC code as per the up/down counter's next value. In case the load current is more than the FHC_limit, the scheme updates the DAC code to the FHC_limit code and starts the counter from the FHC_limit code. As such, current excursions are identified and post excursion mitigation measures such as throttling are timely realized.

While the embodiments are illustrated with reference to sensing current, an analog quantity, it can be extended to sense any analog signal. The analog signal can be generated by any circuitry. In the example here, the circuitry comprises HSFET and LSFET. The analog signal is converted to a digital representation by an analog-to-digital converter (ADC). In the example herein, the analog-to-digital converter comprises comparator 101, level-shifter 102, and sampling sequential unit 103 (e.g., flip-flop). The output of the ADC is received by a finite state machine (e.g., tracking ADC 104). The finite state machine generates an adaptive digital code in accordance with the digital representation and a threshold. The adaptive digital code controls a parameter that replicates the analog signal. In the example herein, the parameter is the DAC current $I_{DAC}$. A digital-to-analog converter (DAC) receives the adaptive digital code and controls the parameter that replicates the analog signal.

In some embodiments, the finite state machine is to cause the adaptive digital code to toggle between a code representative of the threshold and a code being generated by an up/down counter, if the analog signal rises but is below the threshold. In some embodiments, the finite state machine is to cause the adaptive digital code to follow an output of an up/down counter, if the analog signal falls and is below the threshold. In some embodiments, the analog signal is a current through an inductor coupled to the circuitry, and wherein the adaptive digital code represents current through the inductor. In some embodiments, a first logic is provided to generate an interrupt when the adaptive digital code crosses the threshold. In some embodiments, a second logic is provided to throttle a processor in response to the interrupt. In some embodiments, the threshold is programmable by software (e.g., operating system) or hardware (e.g., fuses).

In some embodiments, the threshold is a first threshold, and wherein the finite state machine is to generate the adaptive digital code in accordance with an output of the sequential unit and the first and second thresholds, and wherein the second threshold is higher than the first threshold. In some embodiments, the finite state machine is to cause the adaptive digital code to toggle between a code representative of the first threshold and a code representative of the second threshold, if the analog signal rises but is below the first and second thresholds. In some embodiments, the finite state machine is to cause the adaptive digital code to follow an output of an up/down counter, if the analog signal falls and is below the first and second thresholds.

Figure 2:
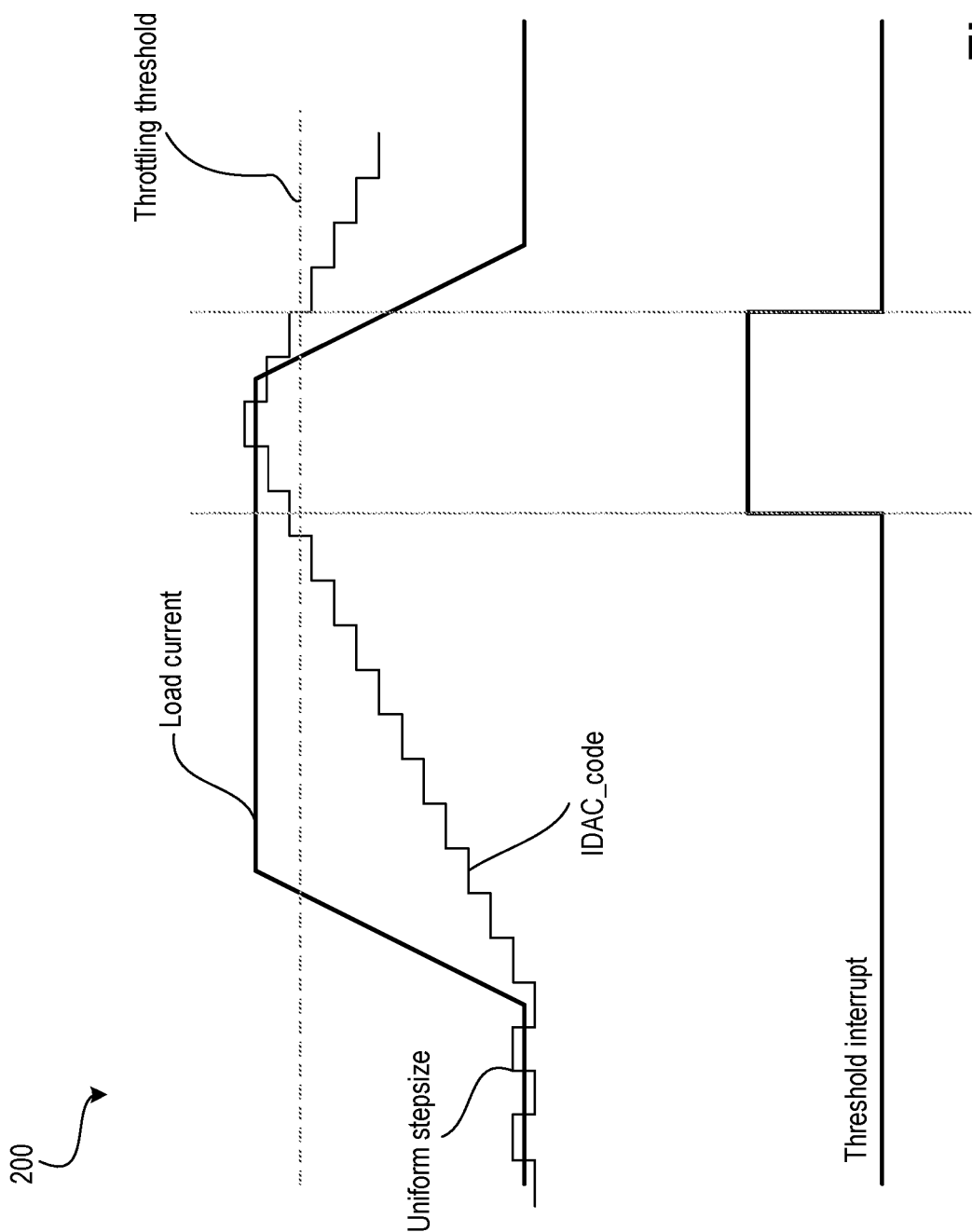
FIG. 2 illustrates a timing diagram showing load current tracking with single step.

FIG. 2 illustrates timing diagram 200 showing load current tracking with single step. In this example, current profile (e.g., load current) through inductor L is illustrates as a pulse. To sense that current, traditional IDAC_Code would look like a uniform staircase when tracking the ramp of the local current. The staircase would be a rising staircase when inductor current is rising, a falling staircase when inductor current is falling, and dithering when the inductor current is stable. The step size is fixed in this example. When IDAC_Code crosses the throttling threshold (e.g., FHC_limit), then a threshold interrupt is generated. In this example, the IDAC_Code crosses the throttling threshold well after the load current (or inductor current) crossed the throttling threshold, resulting in a late generation of the throttling interrupt. A late throttling interrupt will result in a late throttling process.

A possible implementation to detect fast peaks in current is to use parallel hardware where the digital code corresponding to the maximum current threshold is sent continuously to the DAC and compared with an actual load current. If load current is more than the DAC output, FHC_INT is generated. However, parallel hardware incurs area and power penalty due to an additional DAC and comparator. Another way to detect fast current spikes or ramps is to use adaptive steps.

Figure 3:
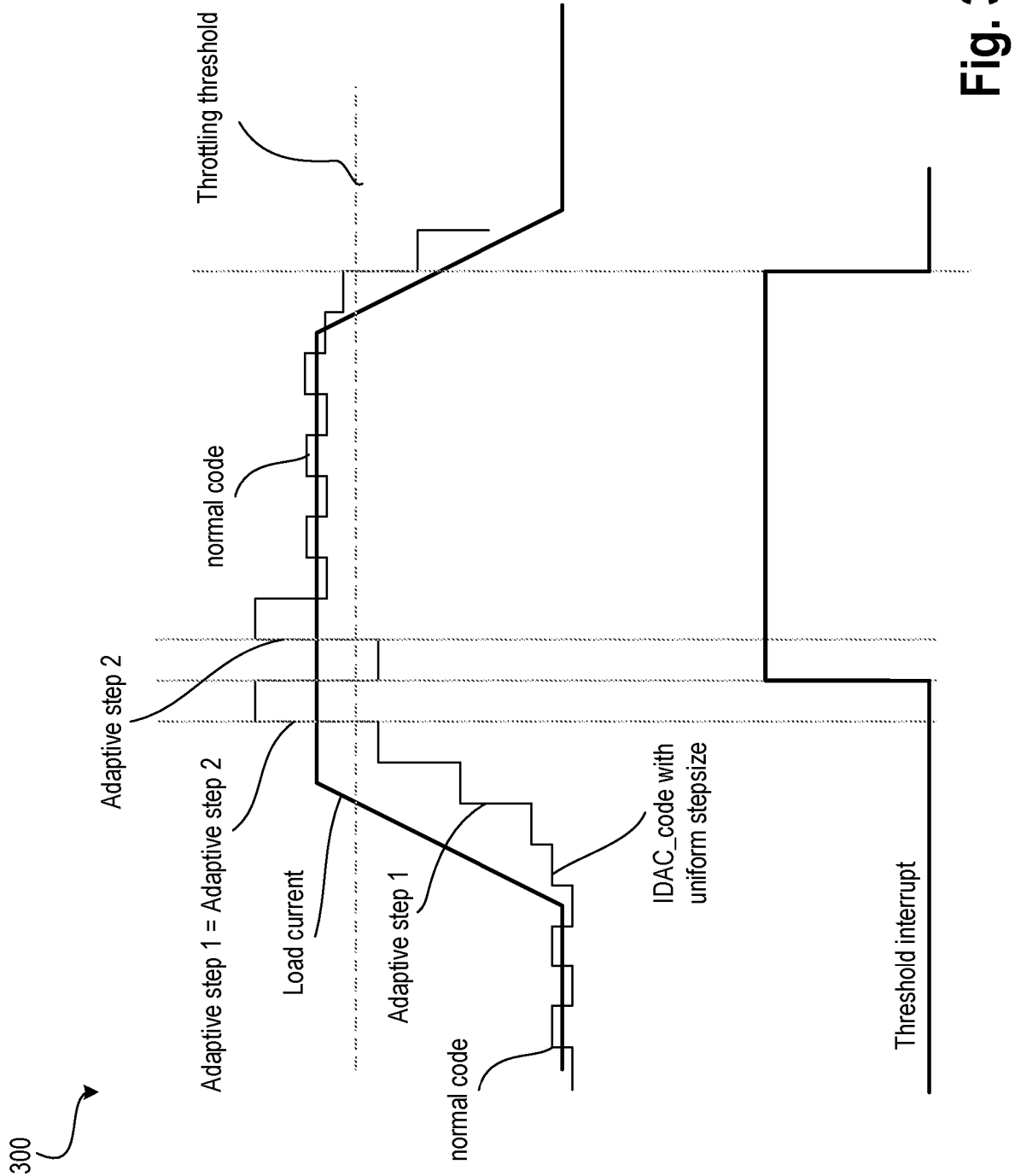
FIG. 3 illustrates a timing diagram showing load current tracking with adaptive steps.

FIG. 3 illustrates timing diagram 300 showing load current tracking with adaptive steps. Compared to the uniform step size of IDAC_Code, here tracking ADC 104 outputs a regular uniform step sized IDAC_Code when the IDAC_Code is tracking the load current. When the IDAC_Code is no longer tracking the load current for a predetermined (or programmable) number of step counts, tracking ADC 104 switches to an adaptive step size (e.g., Adaptive Step 1) and tries to track the load current better or closer. In this example, the predetermined number of step counts corresponds to two switching cycles.

When the IDAC_Code is no longer tracking the load current for a predetermined (or programmable) number of step counts of adaptive step 1, tracking ADC 104 switches to a more aggressive adaptive step size (e.g., Adaptive Step 2) and tries to track the load current better or closer. Once the IDAC_Code is dithering within 1 LSB (or a predetermined number of LSBs), then tracking ADC 104 may switch its scheme back to normal step-size to generate a normal code.

When IDAC_Code crosses the throttling threshold (e.g., FHC_limit), then a threshold interrupt is generated. In this example, the IDAC_Code crosses the throttling threshold after the load current (or inductor current) crossed the throttling threshold, but before it did in timing diagram 200 when fixed or uniform step size was used. In this example, a late throttling interrupt is generated because the adaptive step size was not large enough to track the fast rising ramp of load current. A late throttling interrupt results in a late throttling process.

Referring back to FIG. 1, in various embodiments, tracking ADC 104 employs a smart current sensing method to sense fast current changes above the maximum limit using existing hardware and in conjunction with normal current tracking. In some embodiments, a maximum current limit (FHC_limit) code is sent out by tracking ADC 104 at any instant the load current is detected to be more than normal DAC code.

Here, a maximum current limit or current limit code refers to a DAC code associated with a threshold of a current. The threshold may correspond to a limit if crossed causes an interrupt to be issued, which in term causes a subsequent action such as throttling. While the embodiments are described with reference to current threshold, the embodiments are applicable to any signal property threshold such as voltage threshold. Here, normal DAC code represents the output of tracking ADC 104 that is achieved from uniform increase or decrease in code step size (or LSB) as derived from an up/down counter.

Figure 4:
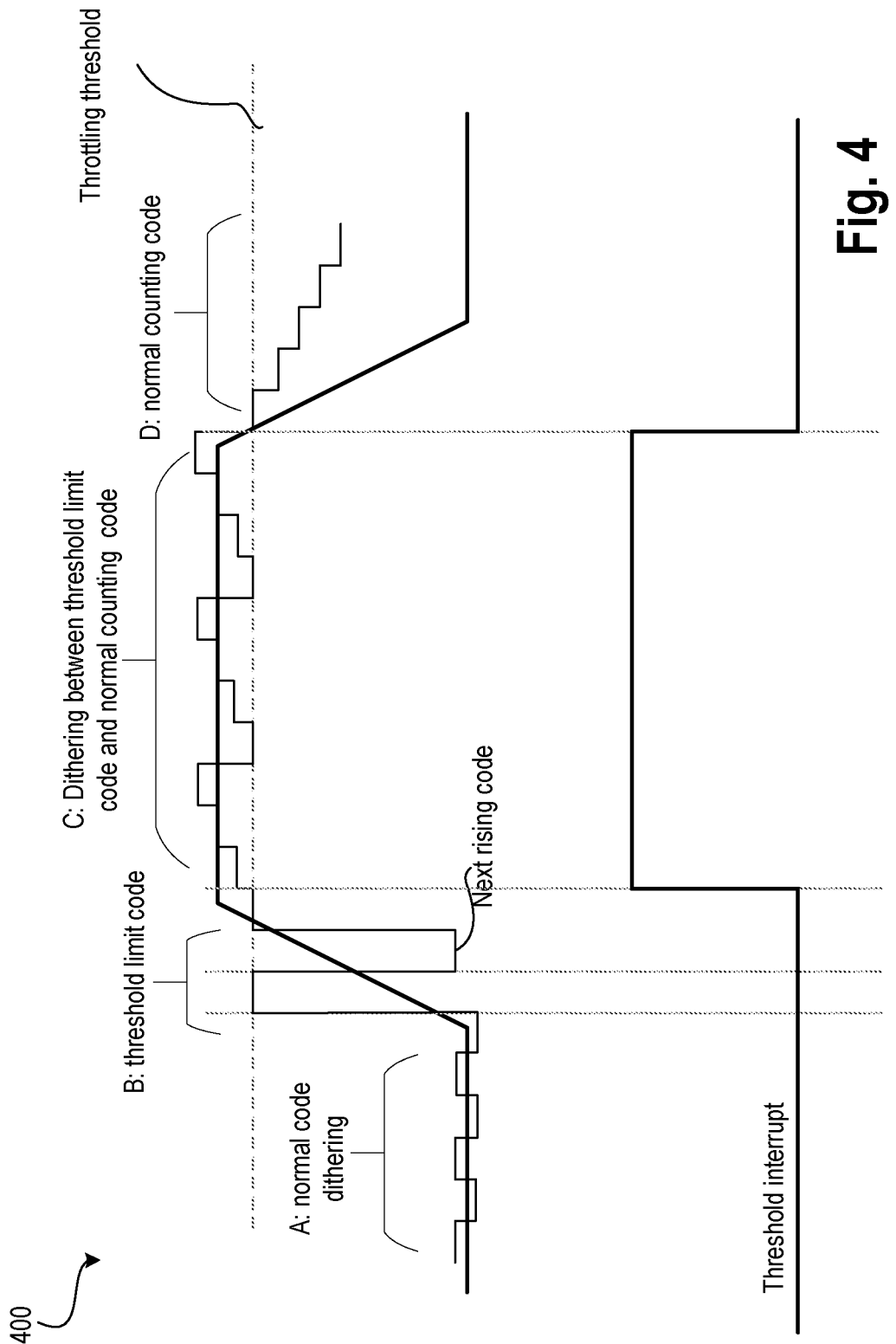
FIG. 4 illustrates a timing diagram showing adaptive tracking with a single threshold, in accordance with some embodiments.

FIG. 4 illustrates timing diagram 400 showing adaptive tracking with a single threshold, in accordance with some embodiments. The counter of ADC tracking 104 operates on the clock that generates HSFET_ON and LSFET_ON pulses. As such, the code update is synchronized with the switching activity of the converter.

In some embodiments, if the load current is less than the FHC_limit current, tracking ADC 104 restores the IDAC_code to next DAC code as per the up/down counter. This is illustrated by the normal code dithering section A.

In the case the load current is more than the FHC_limit current (e.g., the throttling threshold), tracking ADC 104 updates the IDAC_Code to FHC_limit code (e.g., threshold limit step based code) and starts the up/down counter to start counting from the FHC_limit code. The next rising step of the normal code counting becomes the base of the threshold limit step. This is illustrated by section B.

In some embodiments, if the load current is continuously increasing, but is below the FHC_limit, the DAC code counter of tracking ADC 104 keeps switching the IDAC_code between the FHC_limit code and counting up. This is illustrated by section C. As such, when the IDAC_Code reaches near the load current, and the load current is stable, tracking ADC 104 keeps switching the IDAC_Code between the FHC_limit code and two counts (or any predetermined or programmable up/down count) near the actual load current.

In some embodiments, if the load current increases fast above the FHC_limit (e.g., in the case of a current excursion or overshoot), the DAC counter of tracking ADC 104 adapts itself to the FHC_limit code and starts tracking the load current from above the FHC_limit.

In some embodiments, if there is negative load step and the load current falls rapidly from the FHC_limit, the DAC code counter of tracking ADC 104 adapts itself to the FHC_limit code and starts tracking down the load current from below the FHC_limit. This is illustrated by section D.

In this example, a timely throttle interrupt is generated because the adaptive step size is flexible enough to track the fast rising ramp of load current. A timely throttle interrupt results in a timely throttling process.

Note, that the scheme may show more switching activity. The reason is that the tracking ADC 104 sends out FHC threshold code once in two cycles. The conventional scheme keeps sending two codes; one LSB above and one LSB below steady state value in settled condition. This is, however, insignificant as cycles sending FHC code can be masked and the waveform (e.g., entire waveform) can be averaged for reporting mean value of current.

Figure 5:
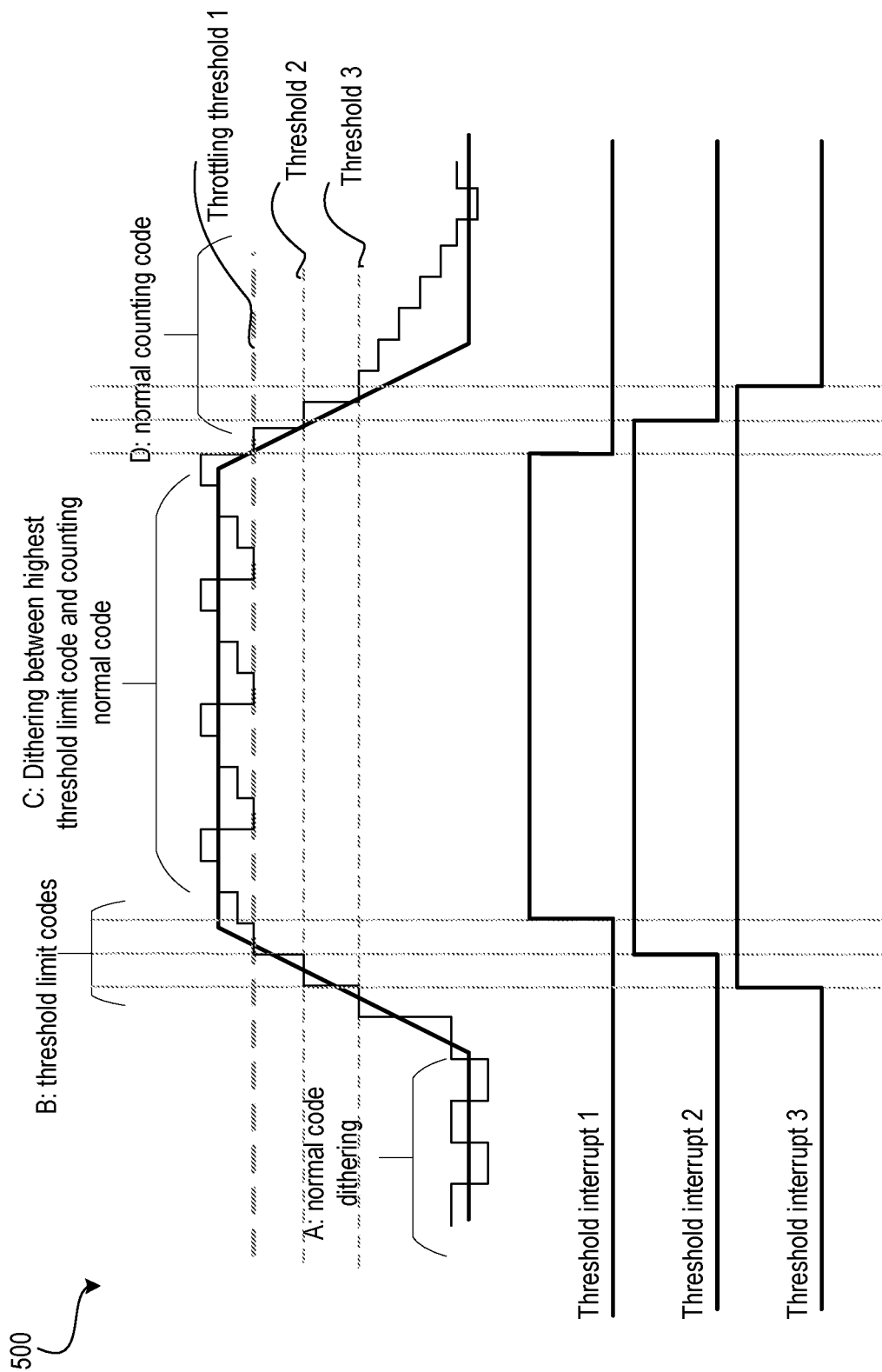
FIG. 5 illustrates a timing diagram showing adaptive tracking with a multiple thresholds, in accordance with some embodiments.
Figure 6A:
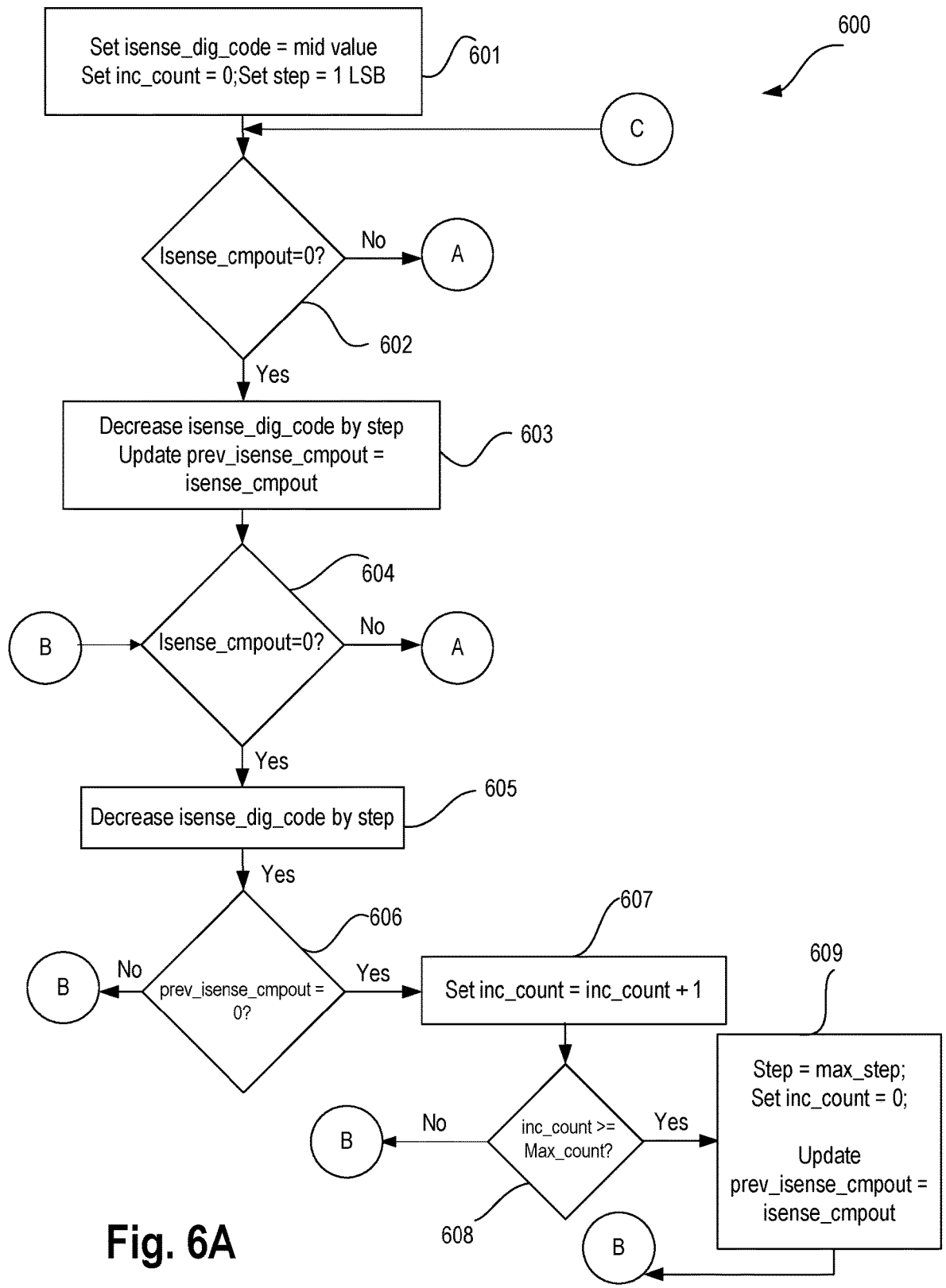
FIGS. 6A-D illustrate a finite state machine for adaptive tracking, in accordance with some embodiments.
Figure 6B:
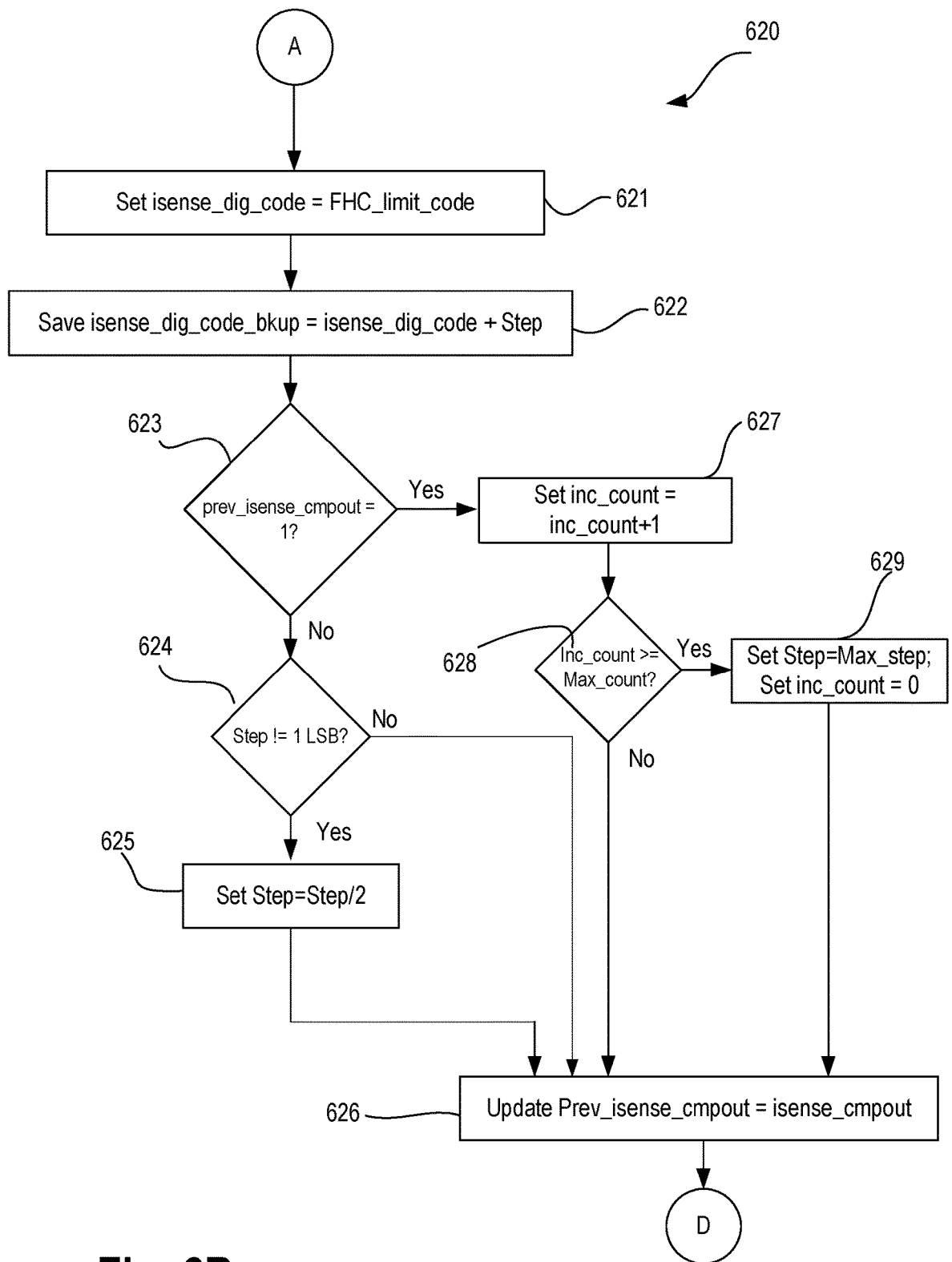
Figure 6C:
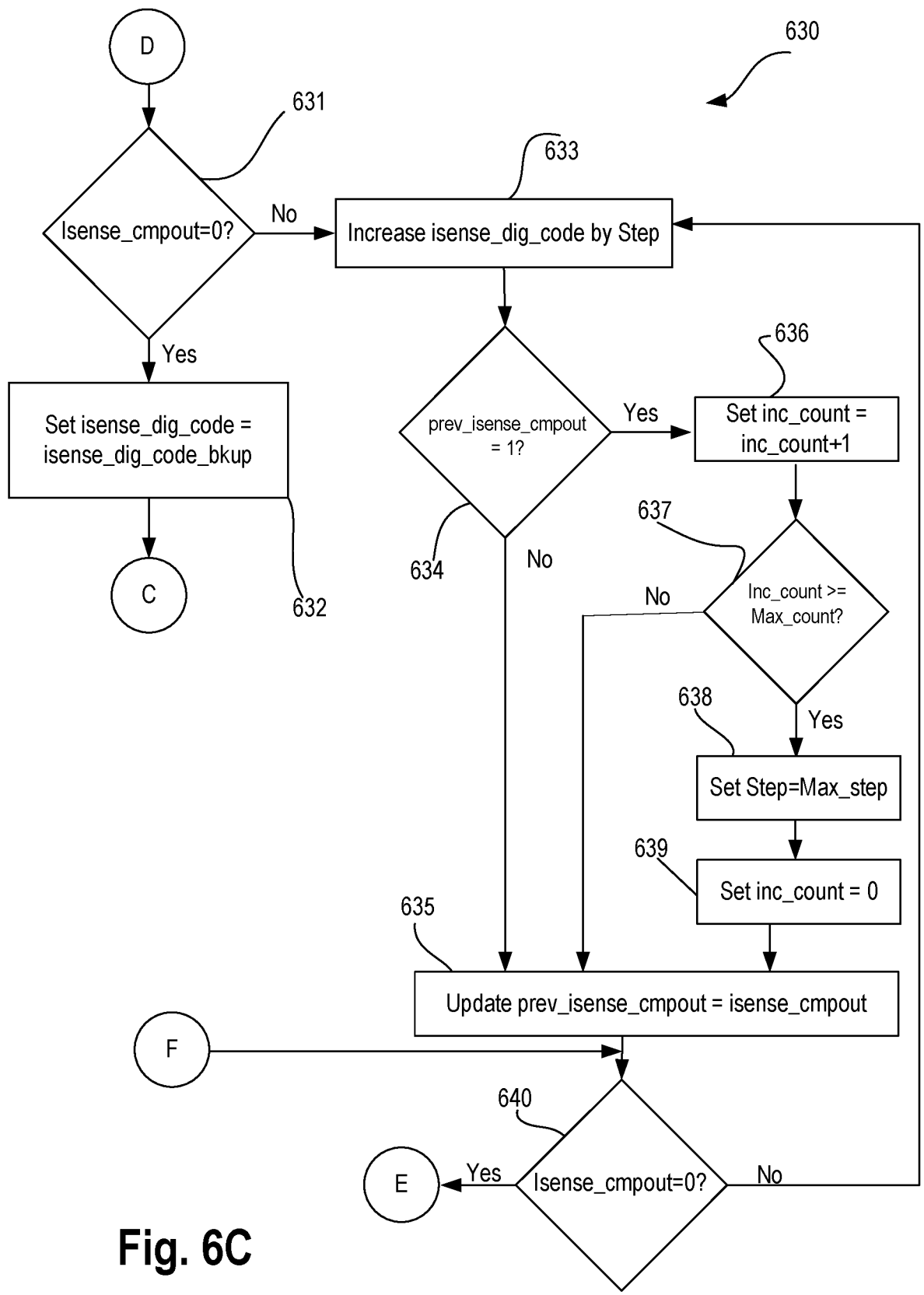
Figure 6D:
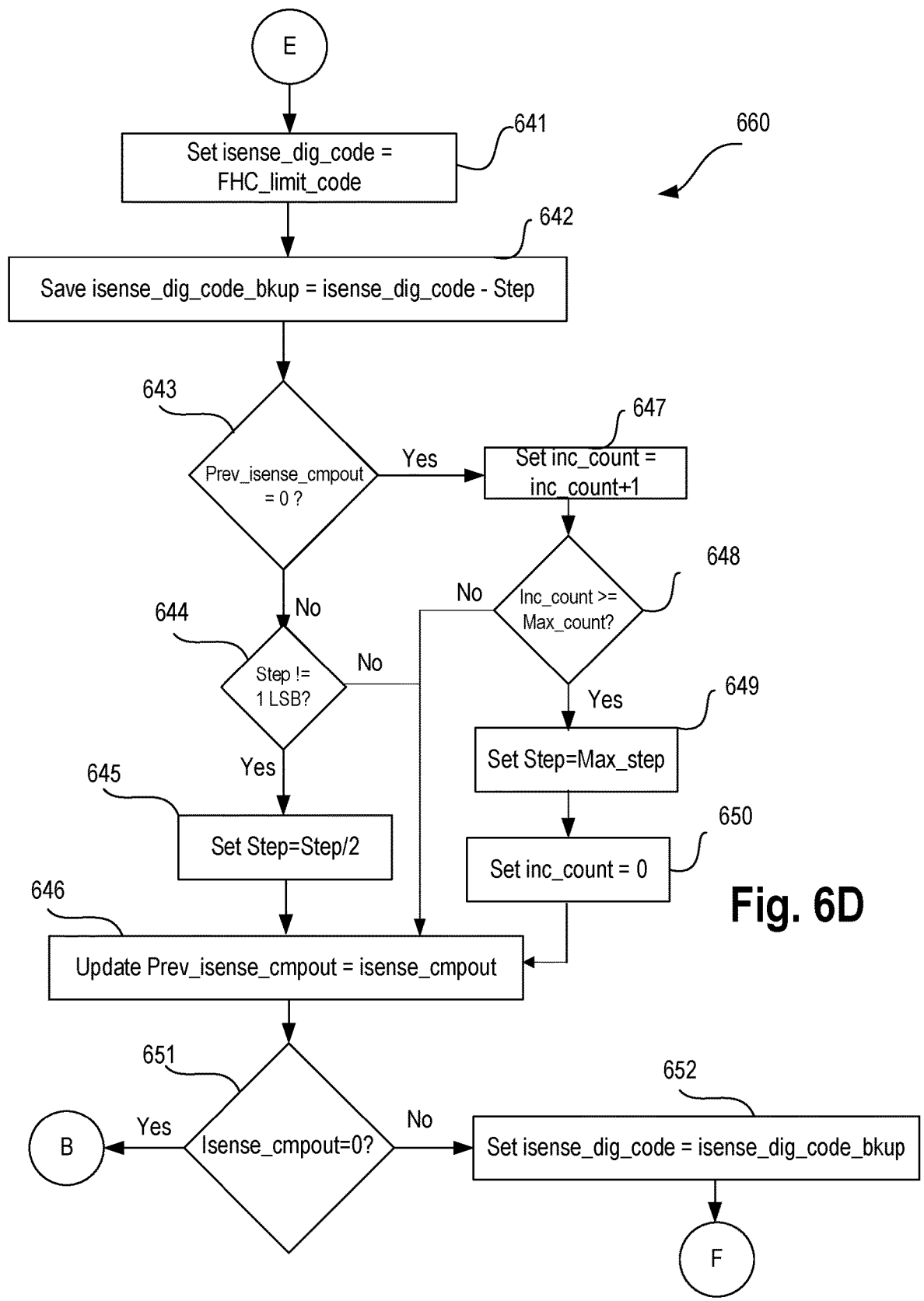

FIG. 5 illustrates timing diagram 500 showing adaptive tracking with a multiple thresholds, in accordance with some embodiments. If current slope is high and current has not yet reached the FHC threshold (e.g., throttling threshold 1), the system behaves like normal tracking scheme and it may not be able to track the slope of current waveform accurately. To follow the current slope more faithfully, different thresholds below the peak can be defined such as threshold 2 and threshold 3. The scheme is modified to step from one threshold to another as the current is increasing as shown by section B. Other sections are similar to those described with reference to FIG. 4. This multi-threshold scheme further improves the telemetry reporting. For example, a user can quickly determine when current crossed a threshold, and upon such crossing a corresponding interrupt may be issued. The interrupt may be used as telemetry or subsequent action. For instance, upon triggering of threshold interrupt 3, SoC may cause a throttling of first type (e.g., frequency setting to f1, and voltage setting to v1), upon triggering of threshold interrupt 2, SoC may cause a throttling of second type (e.g., frequency setting to f2, and voltage setting to v2), and upon triggering of threshold interrupt 1, SoC may cause a throttling of third type (e.g., frequency setting to f3, and voltage setting to v3).

FIGS. 6A-D illustrate flowcharts 600, 620, 630, and 660, respectively, finite state machine (e.g., adaptive ADC 104) for adaptive tracking, in accordance with some embodiments. While various blocks are shown in a particular order, the order can be modified. For example, some blocks (or operations) can be performed in parallel or simultaneously.

The process starts at block 601 by setting or initializing registers isense_dig_code (e.g., IDAC_code) to mid value of the code range, inc_count (e.g., counter output) to zero and step size for the counter (or code) to be 1 LSB. At block 602, a determination is made about the value of Isense_cmpout (e.g., output of comparator 101). While the description refer to the output Isense_cmpout being checked, the sampled value of the output of comparator 101 is checked. For example, the output sampled by flip-flop 103 is checked. If the value of Isense_cmpout is zero then the processor proceeds to block 603. If the value of Isense_cmpout is not zero (e.g., its value is 1), then the processor proceeds to block 621 as indicated by marker A.

At block 603, when the comparator output (Isense_cmpout) is zero, then the IDAC_Code (isense_dig_code) is decreased by the step size (e.g., 1 LSB as set in block 601). Some embodiment comprise a register (prev_isense_cmpout) to track the previous output of comparator 101. The prev_isense_cmpout is assigned the isense_cmpout value.

At block 604, the output Isense_cmpout of comparator 101 is checked again. If the value of Isense_cmpout is zero, the process proceeds to block 605. If the value of Isense_cmpout is 1, the process proceeds to block 621 as indicated by marker A. At block 605, the IDAC_Code (isense_dig_code) is decreased by the step size (e.g., 1 LSB as set in block 601). The process then proceeds to block 606 where the previous output of comparator 101 is checked. If the prev_isense_cmpout is zero, then the process proceeds to block 607. If the prev_isense_cmpout is one, then the process proceeds to block 604 as indicated by marker B. At block 607, the counter value inc_count is incremented by 1.

At block 608, the counter value inc_count is compared with a maximum count value (Max_count). If the counter value inc_count is greater than or equal to the Max_count, the process proceeds to block 609. If the counter value inc_count is less than the Max_count, the process proceeds to block 604 as indicated by marker B. At block 609, the step is set to the maximum step (max step) and the counter value (inc_count) is reset to 0. Here, the maximum step corresponds to the maximum LSB steps defined through software (e.g., operating system, BIOS, etc.) or hardware (e.g., fuse). The register that holds the previous value of the output of comparator 101 is updated with the current value of Isense_cmpout. The process then proceeds to block 604.

When the output Isense_cmpout of comparator 101 is 1, then then the process proceeds to block 621. At block 621, the IDAC_code (isense_dig_code) is set to FHC_limit_code. At block 622, a sum of the isense_dig_code and the Step are saved in a backup register, isense_dig_code_bkup. The process then proceeds to block 623. At block 623, the previous output (prev_isense_cmpout) of comparator 101 is checked. If the prev_isense_cmpout is one, the process proceeds to block 627 where counter value (inc_count) is incremented from its previous value by 1. If the prev_isense_cmpout is zero, the process proceeds to block 624 where the step size is checked. If Step is not equal to 1 LSB, the Step is reduced (e.g., by half) at block 625. The process then proceeds to block 626. If the Step is equal to one, the process proceeds to block 626 from block 624. At block 626, the previous output (prev_isense_cmpout) of comparator 101 is updated with the current value of isense_cmpout. At block 628, after incrementing the counter (inc_count), the value of the counter is compared against a maximum count value (Max_count). If the inc_count is greater than the Max_count, the Step is set to maximum step size (Max_step) and counter value is reset to 0. The process then proceeds to block 629. If the inc_count is less than or equal to Max_count, the process proceeds to block 626. From block 626, the process proceeds to block 631 as indicated by marker D.

At block 631, the output (isense_cmpout) of comparator 101 is checked. If the output isense_cmpout is 0, the process the proceeds to block 633 where IDAC_code (isense_dig_code) is increased by the current Step size. If the output isense_cmpout is 1, the process the proceeds to block 632 where the IDAC_code (isesen_dig_code) is set to the backup value (isense_dig_code_bkup). The process then proceeds to block 602 as indicated by marker C.

After increasing the IDAC_code in block 633, the process proceeds to block 634 where the previous comparator output value (pre-isense_cmpout) is checked. If the prev_isense_cmpout is zero, the process proceeds to block 635 where the prev_isense_cmpout is updated with the current output (isense_cmpout) of the comparator 101. If the prev_isense_cmpout is one, the process proceeds to block 636 where the counter value inc_count is incremented by one. The process proceeds to block 637 where the counter value is compared to maximum step count (Max Count). If the counter value Inc_count is less than or equal to Max_Count, the process proceeds to block 635. If the counter value Inc_count is greater than Max_Count, the process proceeds to block 638. At block 638, the Step is set to the maximum step size, and at block 639 the counter value is reset to 0. The process then proceeds to block 635. After updating the previous comparator output value, the process proceeds to block 640. At block 640, the output (isense_cmpout) of comparator 101 is checked. If isense_cmpout is 0, the process proceeds to block 641 as indicated by marker E. If isense_cmpout is 1, the process proceeds to block 633.

At block 641, the IDAC code is set to the threshold limit code (FHC_limit_code). At block 642, the backup IDAC code is updated with a value lower than the current IDAC_code value by Step. The process then proceeds to block 643 where the previous output of comparator 101 is checked. If the prev_isense_cmpout is one, the process proceeds to block 644 where the Step size is checked. If the step size is not equal to 1 LSB, the process proceeds to block 645 where the step size is reduced (e.g., by half). The process then proceeds to block 646, where the previous comparator output is updated with the current comparator output isense_cmpout. If the prev_isense_cmpout is zero, the process proceeds to block 647 where the counter value (inc_count) is incremented by one. The process proceeds to block 648 where the counter value is compared to maximum step count. If the counter value inc_count is less than Max_count, the process proceeds to block 646. If the counter value Inc_count is greater than or equal to Max_count, the process proceeds to block 649. The Step is set to the maximum step size (Max_step) at block 649. At block 650, the counter value is reset to 0. The process then proceeds to block 646 where the previous comparator output is updated with the current comparator output isense_cmpout. At block 651, the comparator output (isense_cmpout) is checked again. If the Isense_cmpout is zero, the process proceeds to block 604. If the Isense_cmpout is one the process proceeds to block 652 where the IDAC_code (isense_dig_code) is set to the backup value (isense_dig_code_bkup). The process then proceeds to block 640.

FIG. 7 illustrates current comparator circuit 700 (e.g., comparator 101) and associated timing diagram, in accordance with some embodiments. Comparator circuit 700 comprises one or more pre-amplifier stages 701 and 702, capacitors C1, C2, C3, and C4, strong arm latch (SAL) 703, and switches S1, S2, S3, S4, S5, S6, S7, and S8 coupled as shown. In some embodiments, pre-amplifier stages 701 and/or 702 are single-stage amplifiers. In some embodiments, pre-amplifier stages 701 and/or 702 are multi-stage amplifiers. For a two-phase clock COMP_CLK, Phase 1 (Ph1) and Phase 2 (Ph2) are used for controlling the various switches. Ph1 is used to control S1, S2, S3, S4, S5, and S7, while Ph1 is used to control phases S6 and S8. When Ph1 is high, Ph2 is low. The output of SAL 703 is ISENSE_COMPOUT.

During the reset phase Ph1, when the HSFET is off, switches S5 and S7 close so that the two input terminals of the capacitors C3 and C4 are both tied to VDD. During this phase Ph1, the pre-amplifier stage 701 is configured in unity gain feedback mode by closing switches S1 and S2 thereby storing the information of the inherent offset of the pre-amplifier as charges on the capacitors C3 and C4. Likewise, the switches S3, S4 also close in Ph1 and the pre-amplifier second stage 702 is also configured in unity gain feedback mode, thus storing its inherent offset information on capacitors C1 and C2.

During the evaluation phase Ph2, when the HSI-ET is on, switches S5, S7 open and switches S6, S8 close so that two input terminals of the capacitors C3 and C4 now connect to the two VINP and VINN nodes that are to be compared. The differential voltage between VINP and VINN couples to the input of the pre-amplifier 701 through capacitors C3 and C4 which, in turn, amplifies and couples the differential amplified voltage to the input of pre-amplifier 702 through capacitors C1 and C2.

The strong arm latch (SAL) 703 regenerates this differential amplified voltage to rail-to-rail full swing output and latches the value at the rising edge of the SAMPLE node. In this example, VINN connects to the LX node and VINP connects to the SENSEFET drain as shown in FIG. 1. Comparing the differential voltage between the two nodes determines if the $I_{DAC}$ current is higher or lower than the actual load current it indicates. For example, if the HSFET and SENSEFT ratio is 1:1 and the HSI-ET current is higher than the DAC current, the voltage drop across HSFET will be higher than that across the SENSEFET. Thus, the LX voltage will be lower than the SENSEFET drain and the comparator output will be HIGH thereby indicating FSM 104 to increase the $I_{DAC}$ current to converge on the correct IDAC_Code.

Current comparator circuit 700 is a 2-stage switch capacitor comparator with Auto-Offset cancellation followed by a strong-arm latch 703. In ph1 (LSFET is On) both inputs are tied to supply while Pre-Amp Stage 1 701 and Stage 2 702 are configured into unity gain feedback mode, thus storing offsets into capacitors for offset cancellation. In Ph2 (HSFET is on), unity gain feedback is removed, the actual inputs are applied for amplification followed by sampling by signal SAMPLE and regeneration using SAL 703. In this example, the overall delay is less than 1 ns.

Table 1 summarizes the technical effects of the adaptive sensing technique of various embodiments.

TABLE 1

| | Tracking ADC with adaptive step (FIG. 3) | Tracking ADC with additional DAC and comparator | Flash ADC based tracking | Tracking ADC with threshold based adaptive step (FIGS. 4-5) |
|---|---|---|---|---|
| Area | 1X | 2X | 250X | 1X |
| Response Time for FHC interrupt | 12 μS | 1.6 μS | 1.6 μS | 0.38 μS |
| Power | 1X | 2X | 250X | 1X |
| FOM (Area * Response Time) low the better | 12 | 3.2 | 400 | 0.38 |

The scheme of various embodiments has a response time better than tracking ADC with additional DAC and comparator or Flash ADC for same silicon area. As a result, scheme of various embodiments has 10 times better FOM (Area*FHC Response Time) than the best existing technique (Tracking ADC with additional DAC and comparator for FHC_INT) and 1000 times better FOM than Flash ADC.

Figure 8:
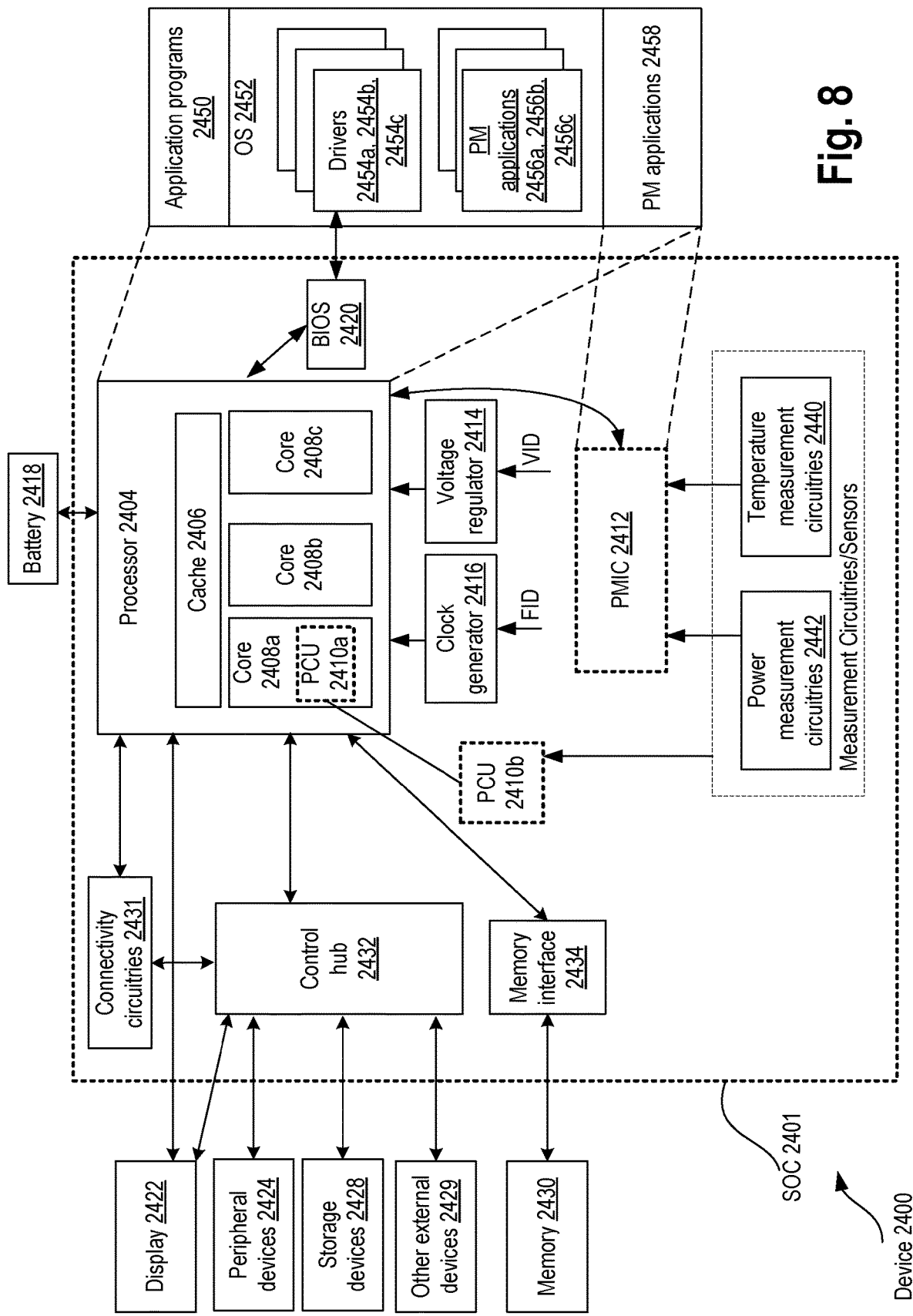
FIG. 8 illustrates a smart device or a computer system or a SoC (System-on-Chip) having adaptive current tracking apparatus, in accordance with various embodiments.

FIG. 8 illustrates a smart device or a computer system or a SoC (System-on-Chip) having adaptive current tracking apparatus, in accordance with various embodiments. It is pointed out that those elements of FIG. 8 having the same reference numbers (or names) as the elements of any other figure can operate or function in any manner similar to that described, but are not limited to such. Any of the blocks described here can have the current tracking apparatus. For example, the LDOs, VRs, and over DC-DC converters can use the scheme described here in to measure the current from different power rails using adaptive current tracking apparatus. Any other block here any also use the adaptive tracking apparatus to track any analog signal.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 8, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408*a*, 2408*b*, 2408*c*. Although merely three cores 2408*a*, 2408*b*, 2408*c* are illustrated in FIG. 8, processor 2404 may include any other appropriate number of processing cores, e.g., tens, or even hundreds of processing cores. Processor cores 2408*a*, 2408*b*, 2408*c* may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408*a*, a second section of cache 2406 dedicated to core 2408*b*, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408*a*, 2408*b*, 2408*c*, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410*a/b* and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410*a*. In an example, some other sections of PCU 2410 may be implemented outside the processing cores 2408, and these sections of PCU 2410 are symbolically illustrated using a dotted box and labelled as PCU 2410*b*. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456*a*, 2456*b*, 2456*c*. The OS 2452 may also include various drivers 2454*a*, 2454*b*, 2454*c*, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Various embodiments described herein are illustrated as examples. The features of these examples can be combined with one another in any suitable way. For example, example 4 can be combined with examples 2 or 5. These examples include:

Example 1: An apparatus comprising: a comparator coupled to a high-side switch and an inductor, and to a current digital-to-analog converter (IDAC), wherein the IDAC controls current through a replica branch coupled to the comparator, wherein the replica branch replicates current through the high-side switch; a sequential unit coupled to an output of the comparator, wherein the sequential unit is to sample the output of the comparator; and a finite state machine to generate an adaptive digital code in accordance with an output of the sequential unit and a threshold, wherein the adaptive digital code is provided to the IDAC to control current through the replica branch.

Example 2: The apparatus of example 1, wherein the finite state machine is to cause the adaptive digital code to toggle between a code representative of the threshold and a code being generated by an up/down counter, if the current through the high-side switch rises but is below the threshold.

Example 3: The apparatus of example 1, wherein the finite state machine is to cause the adaptive digital code to follow an output of an up/down counter, if the current through the high-side switch falls and is below the threshold.

Example 4: The apparatus of example 1, wherein the adaptive digital code represents current through the inductor.

Example 5: The apparatus of example 1 comprises first logic to generate an interrupt when the adaptive digital code crosses the threshold.

Example 6: The apparatus of example 5 comprises second logic to throttle a processor in response to the interrupt.

Example 7: The apparatus of example 1, wherein the threshold is programmable.

Example 8: The apparatus of example 1, wherein the threshold is a first threshold, and wherein the finite state machine is to generate the adaptive digital code in accordance with an output of the sequential unit, the first threshold, and a second threshold, wherein the second threshold is higher than the first threshold.

Example 9: The apparatus of example 8, wherein the finite state machine is to cause the adaptive digital code to toggle between a code representative of the first threshold and a code representative of the second threshold, if the current through the high-side switch rises but is below the first and second thresholds.

Example 10: The apparatus of example 9, wherein the finite state machine is to cause the adaptive digital code to follow an output of an up/down counter, if the current through the high-side switch falls and is below the first and second thresholds.

Example 11: An apparatus comprising: a circuitry to generate an analog signal; an analog-to-digital converter to convert the analog signal to a digital representation; a digital-to-analog converter to receive an adaptive digital code and to control a parameter that replicates the analog signal; and a finite state machine to generate the adaptive digital code in accordance with the digital representation and a threshold.

Example 12: The apparatus of example 11, wherein the finite state machine is to cause the adaptive digital code to toggle between a code representative of the threshold and a code being generated by an up/down counter, if the analog signal rises but is below the threshold.

Example 13: The apparatus of example 11, wherein the finite state machine is to cause the adaptive digital code to follow an output of an up/down counter, if the analog signal falls and is below the threshold.

Example 14: The apparatus of example 11, wherein the analog signal is a current through an inductor coupled to the circuitry, and wherein the adaptive digital code represents current through the inductor.

Example 15: The apparatus of example 11 comprises first logic to generate an interrupt when the adaptive digital code crosses the threshold.

Example 16: The apparatus of example 15 comprises second logic to throttle a processor in response to the interrupt.

Example 17: The apparatus of example 11, wherein the threshold is programmable.

Example 18: The apparatus of example 11, wherein the threshold is a first threshold, and wherein the finite state machine is to generate the adaptive digital code in accordance with an output of the sequential unit, the first threshold, and a second threshold, wherein the second threshold is higher than the first threshold.

Example 19: The apparatus of example 18, wherein finite state machine is to cause the adaptive digital code to toggle between a code representative of the first threshold and a code representative of the second threshold, if the analog signal rises but is below the first and second thresholds.

Example 20: The apparatus of example 19, wherein finite state machine is to cause the adaptive digital code to follow an output of an up/down counter, if the analog signal falls and is below the first and second thresholds.

Example 21: A system comprising: a memory; a processor coupled to the memory; a voltage regulator coupled to the processor; and a wireless interface communicatively coupled to the processor, wherein the voltage regulator includes: a high-side switch coupled to an inductor; a current digital-to-analog converter (IDAC); a comparator coupled to the high-side switch and the inductor, and to the IDAC, wherein the IDAC controls current through a replica branch coupled to the comparator, wherein the replica branch replicates current through the high-side switch; a sequential unit coupled to an output of the comparator, wherein the sequential unit is to sample the output of the comparator; and a finite state machine to generate an adaptive digital code in accordance with an output of the sequential unit and a threshold, wherein the adaptive digital code is provided to the IDAC to control current through the replica branch.

Example 22: The system of example 21, wherein the finite state machine is to cause the adaptive digital code to toggle between a code representative of the threshold and a code being generated by an up/down counter, if the current through the high-side switch rises but is below the threshold.

Example 23: The system of example 21, wherein the finite state machine is to cause the adaptive digital code to follow an output of an up/down counter, if the current through the high-side switch falls and is below the threshold.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:
1. An apparatus comprising:
   a comparator coupled to a high-side switch and an inductor, and to a current digital-to-analog converter (IDAC), wherein the IDAC controls current through a replica branch coupled to the comparator, wherein the replica branch replicates current through the high-side switch;
   a sequential unit coupled to an output of the comparator, wherein the sequential unit is to sample the output of the comparator; and
   a finite state machine to generate an adaptive digital code in accordance with an output of the sequential unit and a threshold, wherein the adaptive digital code is provided to the IDAC to control current through the replica branch.

2. The apparatus of claim 1, wherein the finite state machine is to cause the adaptive digital code to toggle between a code representative of the threshold and a code being generated by an up/down counter, if the current through the high-side switch rises but is below the threshold.

3. The apparatus of claim 1, wherein the finite state machine is to cause the adaptive digital code to follow an output of an up/down counter, if the current through the high-side switch falls and is below the threshold.

4. The apparatus of claim 1, wherein the adaptive digital code represents current through the inductor.

5. The apparatus of claim 1 comprises first logic to generate an interrupt when the adaptive digital code crosses the threshold.

6. The apparatus of claim 5 comprises second logic to throttle a processor in response to the interrupt.

7. The apparatus of claim 1, wherein the threshold is programmable.

8. The apparatus of claim 1, wherein the threshold is a first threshold, wherein the finite state machine is to generate the adaptive digital code in accordance with an output of the sequential unit, the first threshold, and a second threshold, wherein the second threshold is higher than the first threshold.

9. The apparatus of claim 8, wherein the finite state machine is to cause the adaptive digital code to toggle between a code representative of the first threshold and a code representative of the second threshold, if the current through the high-side switch rises but is below the first and second thresholds.

10. The apparatus of claim 9, wherein the finite state machine is to cause the adaptive digital code to follow an output of an up/down counter, if the current through the high-side switch falls and is below the first and second thresholds.

11. An apparatus comprising:
a circuitry to generate an analog signal;
an analog-to-digital converter to convert the analog signal to a digital representation;
a digital-to-analog converter to receive an adaptive digital code and to control a parameter that replicates the analog signal; and
a finite state machine to generate the adaptive digital code in accordance with the digital representation and a threshold.

12. The apparatus of claim 11, wherein the finite state machine is to cause the adaptive digital code to toggle between a code representative of the threshold and a code being generated by an up/down counter, if the analog signal rises but is below the threshold.

13. The apparatus of claim 11, wherein the finite state machine is to cause the adaptive digital code to follow an output of an up/down counter, if the analog signal falls and is below the threshold.

14. The apparatus of claim 11, wherein the analog signal is a current through an inductor coupled to the circuitry, and wherein the adaptive digital code represents current through the inductor.

15. The apparatus of claim 11 comprises first logic to generate an interrupt when the adaptive digital code crosses the threshold.

16. The apparatus of claim 15 comprises second logic to throttle a processor in response to the interrupt.

17. The apparatus of claim 11, wherein the threshold is programmable.

18. The apparatus of claim 11, wherein the threshold is a first threshold, and wherein the finite state machine is to generate the adaptive digital code in accordance with an output of a sequential unit, the first threshold and a second threshold, wherein the second threshold is higher than the first threshold, wherein the sequential unit is coupled to the finite state machine.

19. The apparatus of claim 18, wherein finite state machine is to cause the adaptive digital code to toggle between a code representative of the first threshold and a code representative of the second threshold, if the analog signal rises but is below the first and second thresholds.

20. The apparatus of claim 19, wherein finite state machine is to cause the adaptive digital code to follow an output of an up/down counter, if the analog signal falls and is below the first and second thresholds.

21. A system comprising:
a memory;
a processor coupled to the memory;
a voltage regulator coupled to the processor; and
a wireless interface communicatively coupled to the processor, wherein the voltage regulator includes:
a high-side switch coupled to an inductor;
a current digital-to-analog converter (IDAC);
a comparator coupled to the high-side switch and the inductor, and to the IDAC, wherein the IDAC controls current through a replica branch coupled to the comparator, wherein the replica branch replicates current through the high-side switch;
a sequential unit coupled to an output of the comparator, wherein the sequential unit is to sample the output of the comparator; and
a finite state machine to generate an adaptive digital code in accordance with an output of the sequential unit and a threshold, wherein the adaptive digital code is provided to the IDAC to control current through the replica branch.

22. The system of claim 21, wherein the finite state machine is to cause the adaptive digital code to toggle between a code representative of the threshold and a code being generated by an up/down counter, if the current through the high-side switch rises but is below the threshold.

23. The system of claim 21, wherein the finite state machine is to cause the adaptive digital code to follow an output of an up/down counter, if the current through the high-side switch falls and is below the threshold.

* * * * *